US009432035B2

(12) United States Patent
Vyas et al.

(10) Patent No.: US 9,432,035 B2
(45) Date of Patent: Aug. 30, 2016

(54) MULTICHANNEL ANALOG-TO-DIGITAL CONVERTER

(71) Applicant: ANALOG DEVICES GLOBAL, Hamilton (BM)

(72) Inventors: Bhargav R. Vyas, Bangalore (IN); Arvind Madan, Bangalore (IN); Sandeep Monangi, Srikakulam (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/593,078

(22) Filed: Jan. 9, 2015

(65) Prior Publication Data
US 2016/0204789 A1 Jul. 14, 2016

(51) Int. Cl.
H03M 1/38 (2006.01)
H03M 1/00 (2006.01)
H03M 1/46 (2006.01)
H03M 1/12 (2006.01)
H03M 1/06 (2006.01)

(52) U.S. Cl.
CPC ........... *H03M 1/002* (2013.01); *H03M 1/0604* (2013.01); *H03M 1/1205* (2013.01); *H03M 1/1245* (2013.01); *H03M 1/46* (2013.01); *H03M 1/00* (2013.01); *H03M 1/0695* (2013.01); *H03M 1/12* (2013.01)

(58) Field of Classification Search
CPC ....... H03M 1/0695; H03M 1/12; H03M 1/00
USPC ................. 341/161, 162, 163, 155, 156, 110
See application file for complete search history.

(56) References Cited

U.S. PATENT DOCUMENTS

| 6,304,205 B1 | 10/2001 | Rezvani et al. |
| 7,924,203 B2 | 4/2011 | Hurrell |
| 8,072,360 B2 | 12/2011 | Byrne et al. |
| 8,248,283 B2 | 8/2012 | Mandal et al. |

(Continued)

FOREIGN PATENT DOCUMENTS

EP 0948122 10/1999

OTHER PUBLICATIONS

Chilann, Ka Yan Chan, "Applying the 'Split-ADC' Architecture to a 16 bit, 1MS/s differential Successive Approximation Analog-to-Digital Converter", A Thesis Submitted to the Faculty of Worcester Polytechnic Institute, Apr. 2008, 175 pages.

(Continued)

*Primary Examiner* — Joseph Lauture
(74) *Attorney, Agent, or Firm* — Patent Capital Group

(57) ABSTRACT

Multichannel successive approximation register (SAR) analog-to-digital converters (ADC), along with methods and systems for multichannel SAR analog-to-digital conversion, are disclosed herein. An exemplary multichannel SAR ADC can include a first SAR ADC for each of a plurality of input channels, and a second SAR ADC, a multiplexer, and a residue amplifier shared among the plurality of input channels. The multiplexer can select an analog residue signal from one of the first SAR ADCs for conversion by the second SAR ADC. The residue amplifier can amplify the selected analog residue signal. The second SAR ADC, multiplexer, and/or residue amplifier may be shared among all of the plurality of input channels. Where the multichannel SAR ADC includes N input channels, the second SAR ADC, multiplexer, and/or residue amplifier may be shared among b channels of the N input channels.

20 Claims, 7 Drawing Sheets

(56) References Cited

U.S. PATENT DOCUMENTS

| | | |
|---|---|---|
| 8,547,271 B2 | 10/2013 | De Geronimo et al. |
| 8,643,522 B2 | 2/2014 | Panigada et al. |
| 8,643,529 B2 | 2/2014 | Lin |
| 2009/0115651 A1* | 5/2009 | Hoang ............... H03M 1/1069 341/141 |
| 2010/0156692 A1 | 6/2010 | Jeon et al. |
| 2010/0315278 A1 | 12/2010 | Hurrell |
| 2011/0299630 A1* | 12/2011 | Petrovic ............. H04B 7/0408 375/340 |
| 2012/0229313 A1* | 9/2012 | Sin .................... H03M 1/1225 341/110 |
| 2014/0079079 A1 | 3/2014 | Mora Puchalt et al. |
| 2014/0232582 A1 | 8/2014 | Lian et al. |

OTHER PUBLICATIONS

Walt Kester, ADC Architectures II: Successive Approximation ADCs, MT-021 Tutorial, Analog Devices, Rev. A, Oct. 2008, WK, © 2009, Analog Devices, Inc. 14 pages.

Extended Search Report issued in EP Patent Application Serial No. 15186014.5 mailed Jun. 2, 2016, 12 pages.

Application Note 1080, *Understanding SAR ADCs*, © MAXIM Integrated Products, Mar. 1, 2001, 6 pages.

\* cited by examiner

MULTICHANNEL ANALOG-TO-DIGITAL CONVERTER

TECHNICAL FIELD

The present disclosure relates generally to analog-to-digital converters, and more particularly, to multichannel analog-to-digital converters.

BACKGROUND

Multichannel analog-to-digital converters (ADCs) can receive and convert multiple analog signals into corresponding digital signals. Typically, various performance and/or device metrics (such as signal-to-noise ratio, throughput, device footprint, and/or testing time) are balanced to achieve optimal multichannel analog-to-digital conversion. For example, a multichannel ADC that achieves optimal signal-to-noise ratio and throughput may occupy a larger than desirable device footprint, while a multichannel ADC that achieves optimal device footprint often suffers from signal-to-noise ratio and throughput losses. Accordingly, although multichannel ADCs have been generally adequate at balancing various performance and/or device metrics, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
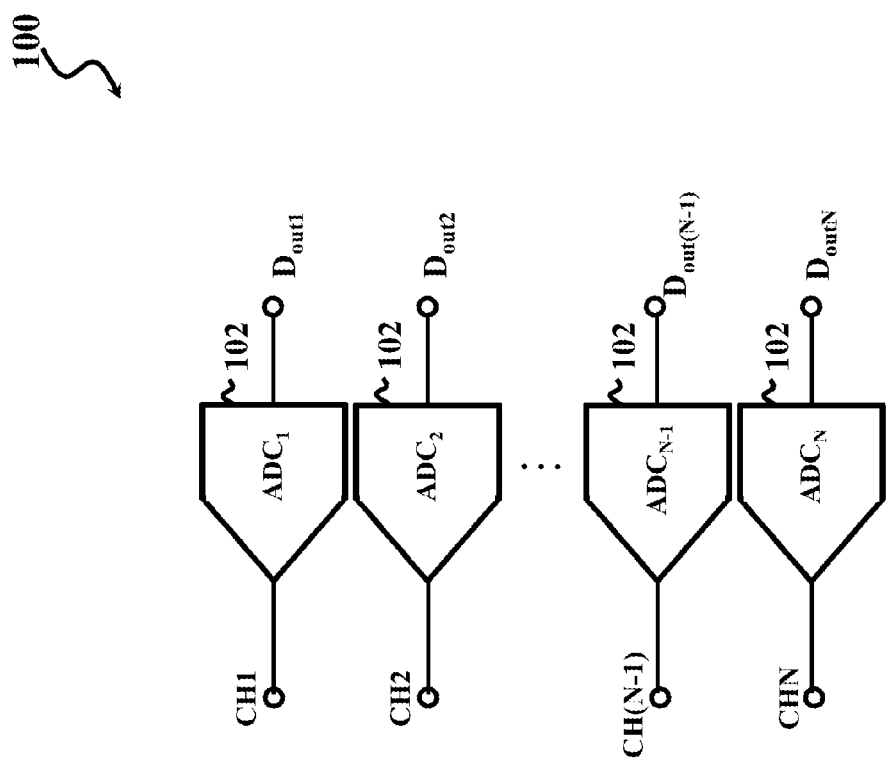
FIG. 1 is a schematic circuit diagram of an exemplary multichannel analog-to-digital converter (ADC) according to various aspects of the present disclosure.

Multichannel successive approximation register (SAR) analog-to-digital converters (ADC), along with methods and systems for multichannel SAR analog-to-digital conversion, are disclosed herein. The multichannel SAR ADCs and associated methods and systems described herein can optimally balance various ADC performance and/or device metrics, including signal-to-noise ratio, throughput (such as analog-to-digital conversion speeds), device area, and/or other performance and/or device metric.

An exemplary multichannel SAR ADC can include a first SAR ADC for each of a plurality of input channels, and a second SAR ADC and a multiplexer shared among the plurality of input channels. The first SAR ADC can receive a respective analog input signal from a respective input channel. The multiplexer can select an analog residue signal from one of the first SAR ADCs for conversion by the second SAR ADC. The multichannel SAR ADC can further include a residue amplifier coupled to the second SAR ADC and the multiplexer, where the residue amplifier is configured to amplify the selected residue analog signal. In various implementations, the second SAR ADC and the multiplexer may be shared among all of the plurality of input channels. In various implementations, where the multichannel SAR ADC includes N input channels, the second SAR ADC and the multiplexer may be shared among b channels of the N input channels, the multiplexer is configured to select the analog residue signal from one of the first SAR ADCs associated with the b channels. The multichannel SAR ADC may include N/b second SAR ADCs, multiplexers, and/or residue amplifiers, such that each second SAR ADC performs conversion for b channels.

In various implementations, the first SAR ADCs are configured to generate in parallel a respective first digital signal and a respective analog residue signal from the respective analog input signal, and the second SAR ADC is configured to serially generate second digital signals from the respective analog residue signals. In some implementations, the first SAR ADCs are configured to resolve a first few bits of an analog input signal, and the second SAR ADC is configured to resolve remaining bits of the analog input signal. The first SAR ADCs may directly sample respective analog input signals. In various implementations, the first SAR ADCs include a first comparator, a first digital-to-analog converter (DAC), and a first SAR controller; and the second SAR ADC includes a second comparator, a second DAC, and a second SAR controller. Each first SAR ADC can generate the respective first digital signal by comparing the respective analog input signal with a respective first DAC reference voltage; and the second SAR ADC can generate the second digital signal for each channel by comparing each respective analog residue signal with a second DAC reference voltage. In various implementations, multichannel SAR ADC further includes a mini-ADC coupled to the first SAR ADC for each of the plurality of input channels. In various implementations, where the first SAR ADC is configured to perform a p-bit analog-to-digital conversion, the mini-ADC can be configured to generate x bits of the p-bit analog-to-digital conversion.

An exemplary method for performing multichannel successive approximation register (SAR) analog-to-digital conversion includes performing a first SAR analog-to-digital conversion on a plurality of analog input signals; selecting an analog residue signal from among the first SAR analog-to-digital conversions; and performing a second SAR analog-to-digital conversion on the selected analog residue signal. The method can further comprise amplifying the selected analog residue signal. The method can further include directly sampling the plurality of analog input signals. In various implementations, the analog residue signal can be selected from among all of the first SAR analog-to-digital conversions. In various implementations, where the plurality of analog input signals includes N analog input signals, the analog residue signal can be selected from among b of the first SAR analog-to-digital conversions. In various implementations, performing the first SAR analog-to-digital conversions includes generating in parallel a respective first digital signal and a respective analog residue signal from a respective analog input signal; and performing the first SAR analog-to-digital conversions includes serially generating second digital signals from the respective analog residue signals. In various implementations, where the first SAR analog-to-digital conversion is a p-bit analog-to-digital conversion, the method can further include performing an analog-to-digital conversion to generate x bits of the p-bit analog-to-digital conversion.

DETAILED DESCRIPTION OF EXAMPLE EMBODIMENTS

Various multichannel analog-to-digital (ADC) converters are disclosed herein. The multichannel ADCs, and associated methods and systems described herein, can optimally balance various ADC performance and/or device metrics, including signal-to-noise ratio, throughput (such as analog-to-digital conversion speeds), device area, and/or other performance and/or device metric.

FIG. 1 is a simplified schematic circuit diagram of an exemplary multichannel analog-to-digital converter (ADC) 100 according to various aspects of the present disclosure. Multichannel ADC 100 is an electronic device (including an electronic circuit and/or one or more electronic components) configured to receive and convert an analog input signal into a digital output signal. The digital output signal can represent an n-bit digital code, where n is any number depending on design requirements of multichannel ADC 100. In various implementations, multichannel ADC 100 represents an N-channel ADC, where N is a total number of channels, and multichannel ADC 100 is configured to convert analog signals from N channels into corresponding digital signals. FIG. 1 has been simplified for the sake of clarity to better understand the inventive concepts of the present disclosure. Additional features can be added in multichannel ADC 100, and some of the features described can be replaced or eliminated in other embodiments of multichannel ADC 100.

Multichannel ADC 100 includes an input for receiving analog signals $V_{in1}$, $V_{in2}$, ..., $V_{in(N-1)}$, and $V_{inN}$ via channels CH1, CH2, ..., CH(N-1), and CHN. In FIG. 1, multichannel ADC 100 includes a dedicated ADC per channel, such as an ADC 102 for conversion in each channel (thus including N ADCs 102). For example, $ADC_1$, $ADC_2$, ..., $ADC_{(N-1)}$, and $ADC_N$ can convert respective analog signal $V_{in1}$, $V_{in2}$, ..., $V_{in(N-1)}$, and $V_{inN}$ into a respective digital signal $D_{out1}$, $D_{out2}$, ..., $D_{out(N-1)}$, and $D_{outN}$ in parallel (simultaneously). In various implementations, $ADC_1$, $ADC_2$, ..., $ADC_{(N-1)}$, and $ADC_N$ can each include a capacitive digital-to-analog converter, which can act as a sampling capacitor for sampling a respective analog signal and holding (locking) its value constant for some period of time. Each ADC can thus sample, hold, and convert its respective analog signal, in some implementations. Multichannel ADC 100 can also include a controller (not shown) coupled to ADCs 102 and/or THs 104 for managing operation thereof. An output of multichannel ADC 100 may be coupled to additional processing components, such as a digital signal processor, for processing digital signals $D_{out1}$, $D_{out2}$, ..., $D_{out(N-1)}$, and $D_{outN}$.

Figure 2:
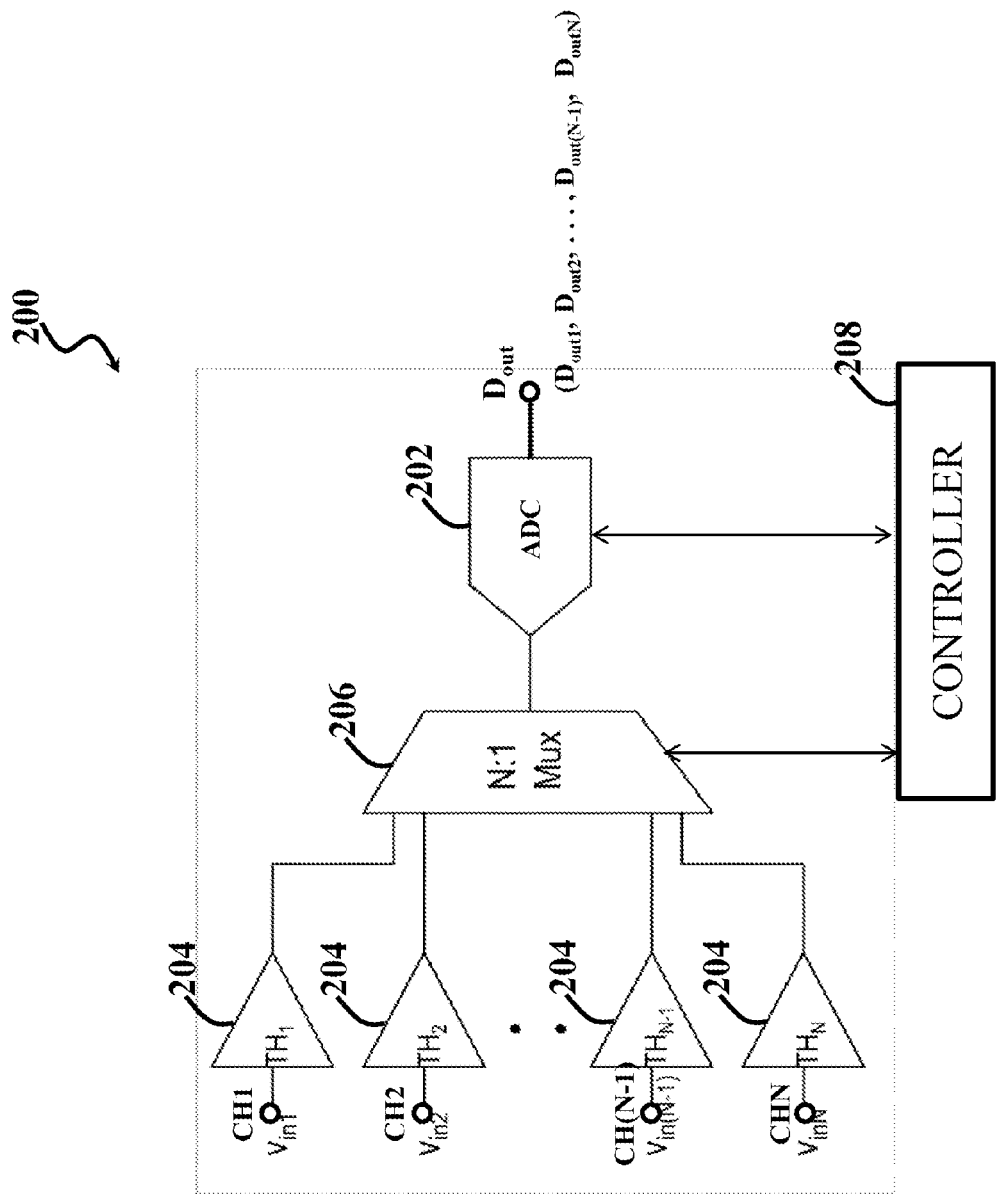
FIG. 2 is a schematic circuit diagram of another exemplary multichannel ADC according to various aspects of the present disclosure.

FIG. 2 is a simplified schematic circuit diagram of another exemplary multichannel analog-to-digital converter (ADC) 200 according to various aspects of the present disclosure. Multichannel ADC 200 is an electronic device (including an electronic circuit and/or one or more electronic components) configured to receive and convert an analog input signal into a digital output signal. The digital output signal can represent an n-bit digital code, where n is any number depending on design requirements of multichannel ADC 200. In various implementations, multichannel ADC 200 represents an N-channel ADC, where N is a total number of channels, and multichannel ADC 200 is configured to convert analog signals from N channels into corresponding digital signals. FIG. 2 has been simplified for the sake of clarity to better understand the inventive concepts of the present disclosure. Additional features can be added in multichannel ADC 200, and some of the features described can be replaced or eliminated in other embodiments of multichannel ADC 200.

Multichannel ADC 200 includes an input for receiving analog signals $V_{in1}$, $V_{in2}$, ..., $V_{in(N-1)}$, and $V_{inN}$ via channels CH1, CH2, ..., CH(N-1), and CHN. In FIG. 2, in contrast to multichannel ADC 100, multichannel ADC 200 includes a single ADC for all channels. For example, multichannel ADC 200 includes ADC 202 for converting respective analog signals $V_{in1}$, $V_{in2}$, ..., $V_{in(N-1)}$, and $V_{inN}$ into a digital signal $D_{out}$. Each channel can include a track-and-hold (TH) 204. For example, $TH_1$, $TH_2$, ..., $TH_{N-1}$, and $TH_N$ sample respective analog signal $V_{in1}$, $V_{in2}$, ..., $V_{in(N-1)}$, and $V_{inN}$ and hold (lock) its value constant for some period of time (for example, during the analog-to-digital conversion implemented by ADC 202). In various implementations, THs 204 include a capacitor component for holding the sampled analog signals, such that THs 204 may be referred to as a sampling capacitors. A multiplexer 206 is configured to select one of analog signals $V_{in1}$, $V_{in2}$, ..., $V_{in(N-1)}$, and $V_{inN}$ for transmitting to ADC 202 for conversion. In the depicted embodiment, multiplexer 206 is an N:1 multiplexer, having an input coupled to N channels (here, via THs 204) and an output coupled to ADC 202. In operation, multiplexer 206 provides one of analog signals $V_{in1}$, $V_{in2}$, ..., $V_{in(N-1)}$, and $V_{inN}$ to ADC 202, such that multichannel ADC 200 can serially convert analog signals $V_{in1}$, $V_{in2}$, ..., $V_{in(N-1)}$, and $V_{inN}$ into digital signal $D_{out}$ (generally representing each digital signal $D_{out1}$, $D_{out2}$, ..., $D_{out(N-1)}$, and $D_{outN}$ for respective channel CH1, CH2, ..., CH(N-1), and CHN). In some implementations, multichannel ADC 200 implements a charge sharing scheme to effectively minimize power and device area. For example, instead of having multiple ADCs and their associated capacitive digital-to-analog converters sample and hold the analog input signals, multichannel ADC 200 includes dedicated sampling capacitors that share charge with ADC 202. In particular, each TH 204, which sample analog input signals, has a dedicated sampling capacitor that can share charge with capacitors of ADC 202, as and when conversion happens. For example, multichannel ADC 200 can convert each analog signal by connecting each TH 204 to ADC 202. Though such charge sharing scheme provides an optimal solution for overcoming device area limitations, performance metrics, such as signal-to-noise ratio and throughput, can be degraded since signal power losses often result from the charge sharing between capacitors of THs 204 and capacitors of ADC 202. A controller 208 may be coupled with ADC 202, THs 204, and/or multiplexer 206 for managing operation thereof. An output of multichannel ADC 200 may be coupled to additional processing components, such as a digital signal processor, for processing digital signal $D_{out}$.

Multichannel ADC 100 and multichannel ADC 200 balance various performance and/or device metrics. For example, by implementing a dedicated ADC per channel, multichannel ADC 100 can minimize signal-to-noise ratio and throughput (such as conversion speed) losses. However, such configurations can consume larger than desirable device area and exhibit higher than desirable testing time. To combat such deficiencies, by implementing a single ADC for all channels, multichannel ADC 200 can significantly decrease device area (optimizing space-efficiency) and achieve lower test times when compared to multichannel ADC 100, though such benefits are traded for less than desirable signal-to-noise ratio and throughput losses. Solutions are thus needed for optimally balancing performance and device metrics (such as signal-to-noise ratio, throughput, device area, and/or other performance and device metric) for multichannel ADCs.

Figure 3:
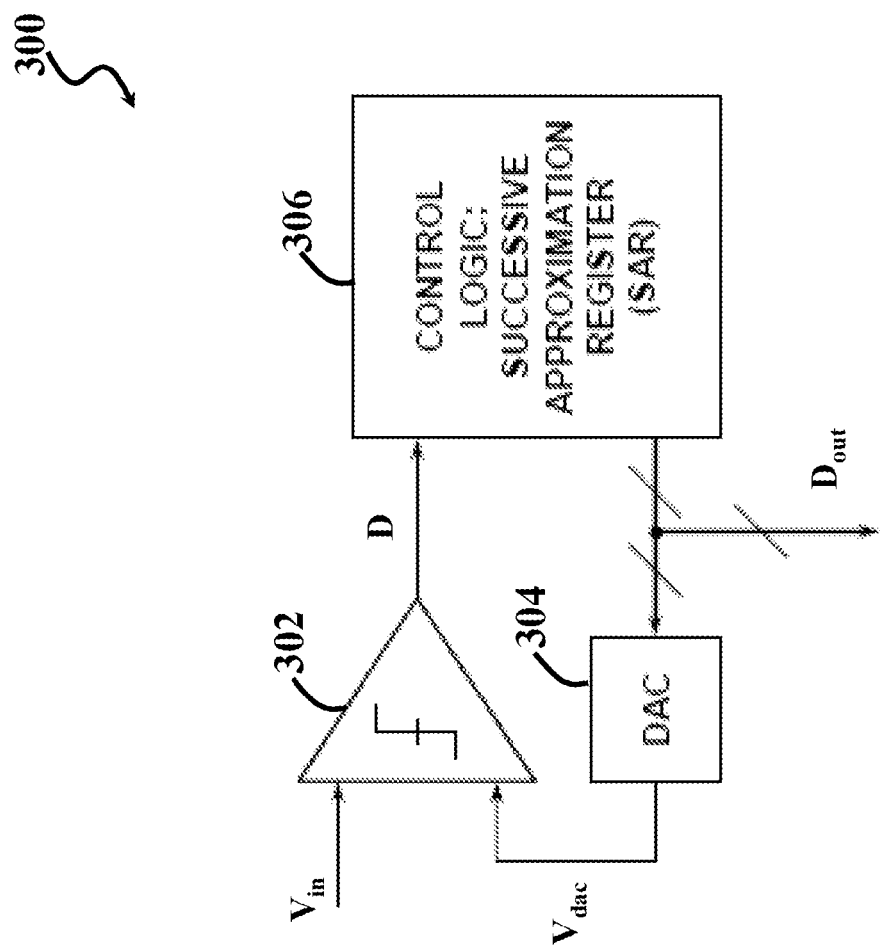
FIG. 3 is a schematic circuit diagram of an exemplary successive approximation register (SAR) ADC according to various aspects of the present disclosure.

To minimize area and power consumption, multichannel ADC 100 and multichannel ADC 200 can implement successive approximation register analog-to-digital converters (SAR ADCs). For example, in various implementations, multichannel ADC 100 and multichannel ADC 200 can configure ADCs 102 and ADC 202 as SAR ADCs. FIG. 3 is a simplified schematic circuit diagram of an exemplary SAR ADC 300 according to various aspects of the present disclosure. SAR ADC 300 is an electronic device (including an electronic circuit and/or one or more electronic components) configured to receive and convert an analog input signal $V_{in}$ into a digital output signal $D_{out}$. The digital output signal $D_{out}$ can represent an n-bit digital code, where n is any number depending on design requirements of SAR ADC 300. Generally, SAR ADC 300 implements a successive approximation algorithm to provide digital output signal $D_{out}$. FIG. 3 has been simplified for the sake of clarity to better understand the inventive concepts of the present disclosure. Additional features can be added in SAR ADC 300, and some of the features described can be replaced or eliminated in other embodiments of SAR ADC 300.

SAR ADC 300 includes a comparator 302 coupled to a digital-to-analog-converter (DAC) 304 and a SAR controller 306. SAR ADC 300 converts analog input signal $V_{in}$ into digital output signal $D_{out}$ by successively changing an output of DAC 304 (for example, a reference voltage, such as reference voltage $V_{dac}$) and comparing the output to analog input signal $V_{in}$. For example, comparator 302 determines whether analog input signal $V_{in}$ is greater or less than reference voltage $V_{dac}$, and generates a digital signal D based on the comparison. Digital signal D can transition between a low state represented by a digital 0 and a high state represented by a digital 1. SAR controller 306 can include a successive approximation register (SAR) that stores a state of digital signal D, from which SAR controller 306 can generate digital output signal $D_{out}$. SAR controller 306 can manage DAC 304 based on a state of digital signal D received from comparator 302. For example, based on the state of digital signal D, SAR controller 306 can selectively set bit(s) associated with DAC 304. In various implementations, SAR ADC 300 can determine digital output signal $D_{out}$ bit by bit, from a most significant bit to a least significant bit. In such implementations, for determining each bit, SAR controller 306 can generate a digital signal for setting DAC 304, DAC 304 can generate reference voltage $V_{dac}$ based on the setting, and comparator 302 can determine a value for digital signal D by comparing reference voltage $V_{dac}$ to analog input signal $V_{in}$.

The present disclosure describes various multichannel ADC configurations for optimally balancing signal-to-noise ratio (SNR), throughput (such as conversion speed), and device area concerns described above. In particular, the following describes a pipeline SAR ADC configured to achieve a multichannel ADC that optimally balances signal-to-noise ratio (SNR), throughput, and/or device area metrics.

In various implementations, a multichannel pipeline SAR ADC is achieved by having a dedicated SAR ADC for each channel in a first SAR ADC stage, while sharing a SAR ADC in a second SAR ADC stage, along with other portions of the pipeline SAR ADC (such as a multiplexer and/or a residue amplifier), among more than one channel. In some implementations, the second SAR ADC stage, along with other portions of the pipeline SAR ADC (such as the multiplexer and/or the residue amplifier), are shared among all channels. Different embodiments may have different advantages than described herein, and no advantage described herein is required of any embodiment.

Figure 4:
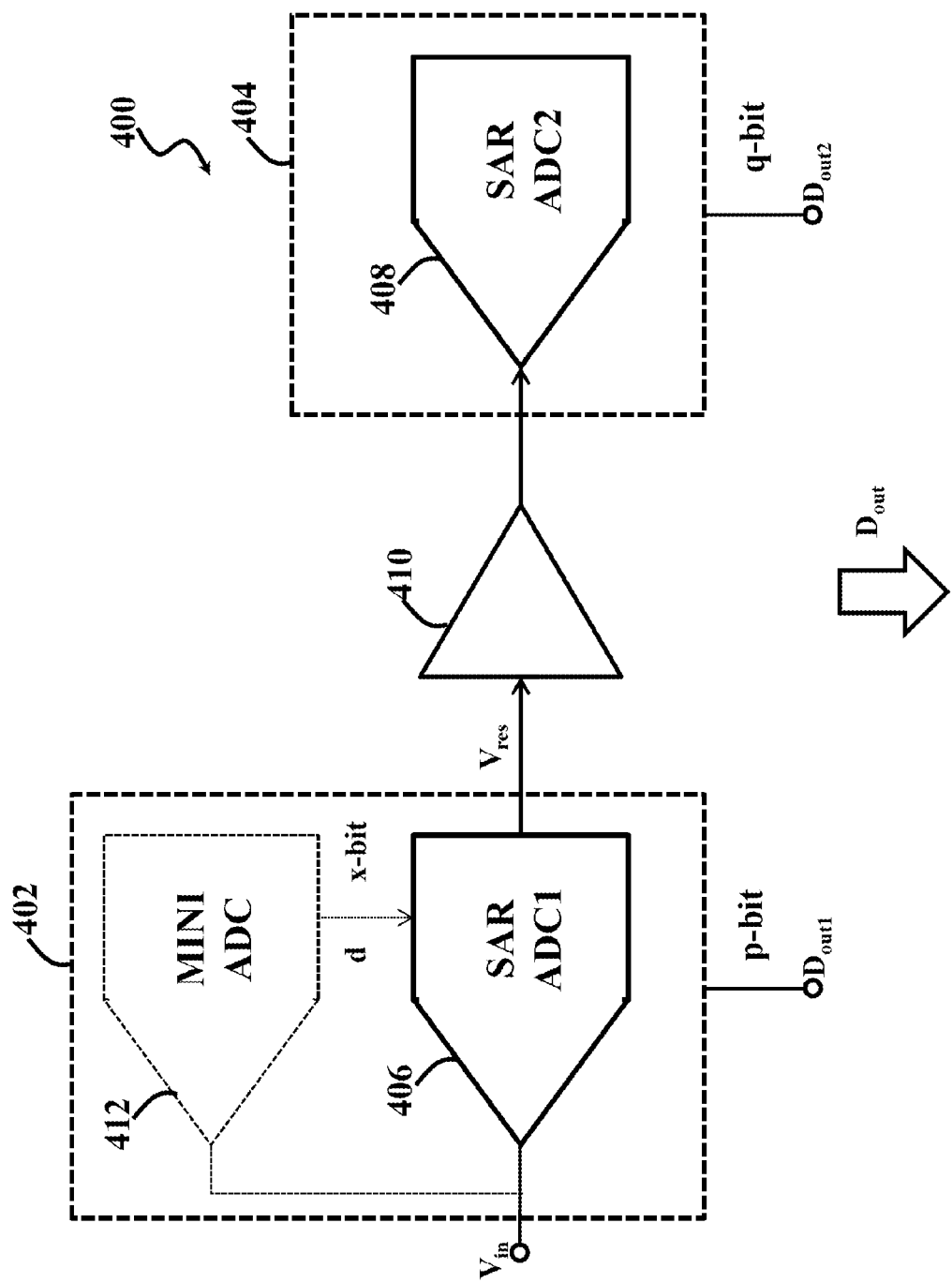
FIG. 4 is a schematic circuit diagram of an exemplary pipeline SAR ADC according to various aspects of the present disclosure.

A pipeline SAR ADC can be implemented with minimal device area and minimal power consumption. FIG. 4 is a simplified schematic circuit diagram of an exemplary pipeline SAR ADC 400 according to various aspects of the present disclosure. Pipeline SAR ADC 400 is an electronic device (including an electronic circuit and/or one or more components) configured to convert an analog input signal into a digital output signal. The digital output signal can represent an n-bit digital code, where n is any number depending on design requirements of pipeline SAR ADC 400. Generally, pipeline SAR ADC 400 implements a successive approximation algorithm to provide digital output signal. FIG. 4 has been simplified for the sake of clarity to better understand the inventive concepts of the present disclosure. Additional features can be added in pipeline SAR ADC 400, and some of the features described can be replaced or eliminated in other embodiments of pipeline SAR ADC 400.

Pipeline SAR ADC 400 includes cascaded stages for converting analog signal $V_{in}$ into a digital signal $D_{out}$. For example, pipeline SAR ADC 400 includes a SAR ADC stage 402 (Stage 1) and a SAR ADC stage 404 (Stage 2), where SAR ADC stage 402 include a SAR ADC 406 (SAR ADC1) and SAR ADC stage 404 includes a SAR ADC 408 (SAR ADC2). In various implementations, SAR ADC1 and SAR ADC2 can be configured as SAR ADC 300 depicted in FIG. 3. Each SAR ADC stage processes (for example, quantizes) an analog input signal to generate a digital output signal and/or an analog residue signal for a next stage of pipeline SAR ADC 400 for further processing. For example, SAR ADC stage 402 processes analog input signal $V_{in}$ to generate a digital signal $D_{out1}$ and an analog residue signal $V_{res}$; and SAR ADC stage 404 processes analog residue signal $V_{res}$ to generate a digital signal $D_{out2}$. Digital signal $D_{out1}$ can represent a p-bit digital code and digital signal $D_{out2}$ can represent a q-bit digital code, where p and q are any number depending on design requirements of pipeline SAR ADC 400. A residue amplifier 410, coupled to SAR ADC stage 402 and SAR ADC stage 404, can process (for example, amplify and/or level shift) analog residue signal $V_{res}$, from SAR ADC 406, such that SAR ADC 408 can digitally convert an amplified version of analog residue signal $V_{res}$. Pipeline SAR ADC 400 can assemble digital signal $D_{out1}$ and digital signal $D_{out2}$ into a digital output signal $D_{out}$, which may be represented as (p+q)-bit digital code. In various implementations, a digital alignment/correction module (not shown) can assemble these digital signals. Digital alignment/correction module can insert appropriate delays, insert bit shifts, correct conversion errors, perform other alignment/correction, or a combination thereof to digital signals $D_{out1}$ and $D_{out2}$ to generate digital output signal $D_{out}$. An output of pipeline SAR ADC 400 may be coupled to additional processing components, such as a digital signal processor, for processing digital signal $D_{out}$.

Furthermore, pipeline SAR ADC 400 can include a controller (not shown) for managing operations thereof.

In some implementations, SAR ADC stage 402 can include a mini-ADC 412 coupled to SAR ADC 406. Mini-ADC 412 and SAR ADC 406 sample a same input, such as analog input signal $V_{in}$, where mini-ADC 412 is configured to convert analog input signal $V_{in}$ into a digital output signal d. Digital output signal d can represent an x-bit digital code. Where SAR ADC 406 performs the p-bit analog-to-digital conversion, mini-ADC 412 can generate x bits of the p-bit analog-to-digital conversion. SAR ADC 406 can load the x-bit digital code and then proceed with converting analog input signal $V_{in}$ into digital output signal $D_{out1}$. In some implementations, mini-ADC 412 is configured to generate most significant bits of the p-bit analog-to-digital conversion. For example, in some implementations, mini-ADC 412 can be configured as a most significant bits ADC, such as that described in U.S. Pat. No. 7,924,203, the entire disclosure of which is incorporated herein by reference. Since mini-ADC 412 can resolve a first few bits of the p-bit analog-to-digital conversion and load the results into SAR ADC 406, which continues conversion with sufficient redundancy, some error can be tolerated in the conversion by mini-ADC 412. Mini-ADC 412 can thus convert less accurately than SAR ADC 406. Accordingly, device requirements for mini-ADC 412 (such as capacitor sizes and/or device sizes of comparators, in SAR implementation or flash-based mini-ADC implementations) can be relaxed quite substantially, resulting in mini-ADC 412 consuming less area than SAR ADC 406.

Figure 5:
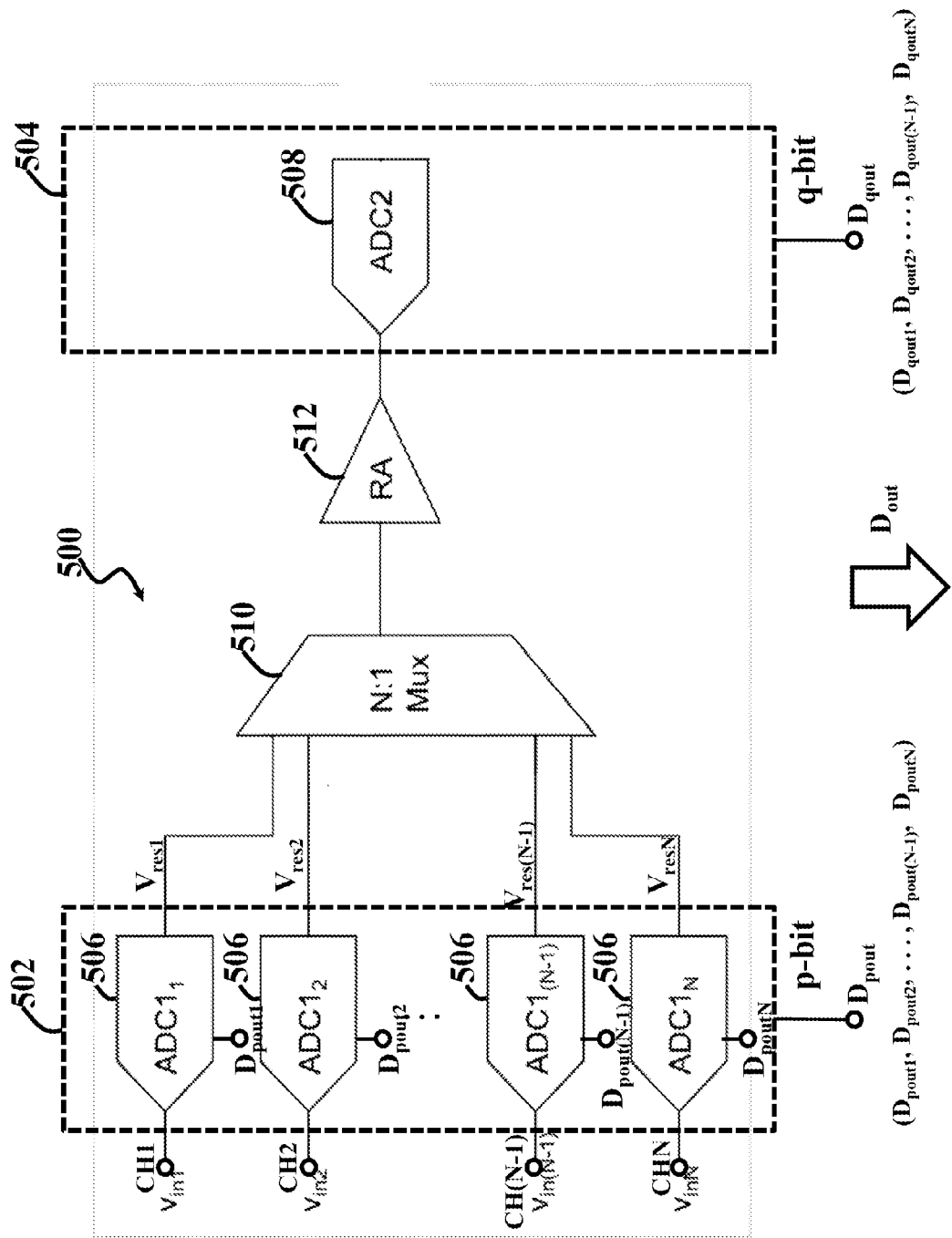
FIG. 5 is a schematic circuit diagram of an exemplary multichannel pipeline SAR ADC according to various aspects of the present disclosure.

The pipeline SAR ADC, such as pipeline SAR ADC 400, can be modified to achieve a multichannel pipeline SAR ADC, which optimally balances various device and performance metrics. FIG. 5 is a simplified schematic circuit diagram of an exemplary multichannel pipeline SAR ADC 500 according to various aspects of the present disclosure. Multichannel pipeline SAR ADC 500 is an electronic device (including an electronic circuit and/or one or more electronic components) configured to receive and convert an analog input signal into a corresponding digital output signal. The digital output signal can represent an n-bit digital code, where n is any number depending on design requirements of multichannel pipeline SAR ADC 500. Multichannel pipeline SAR ADC 500 represents an N-channel ADC, where N is a total number of channels, and multichannel pipeline SAR ADC 500 is configured to convert analog signals from N channels into corresponding digital signals. Generally, multichannel pipeline SAR ADC 500 implements a successive approximation algorithm to provide digital signals. FIG. 5 has been simplified for the sake of clarity to better understand the inventive concepts of the present disclosure. Additional features can be added in multichannel pipeline SAR ADC 500, and some of the features described can be replaced or eliminated in other embodiments of multichannel pipeline SAR ADC 500.

Multichannel pipeline SAR ADC 500 includes an input for receiving analog signals $V_{in1}$, $V_{in2}$, ..., $V_{in(N-1)}$, and $V_{inN}$ via channels CH1, CH2, ..., CH(N-1), and CHN. In FIG. 5, multichannel pipeline SAR ADC 500 includes cascaded stages for converting the analog signals into a digital signal $D_{out}$. For example, multichannel pipeline SAR ADC 500 includes a SAR ADC stage 502 (Stage 1) and a SAR ADC stage 504 (Stage 2). Each SAR ADC stage processes (for example, quantizes) an analog input signal to generate a digital output signal and/or an analog residue signal for a next stage of multichannel pipeline SAR ADC 500 for further processing. For example, SAR ADC stage 502 processes analog input signal $V_{in}$ to generate a digital signal $D_{out1}$ and an analog residue signal; and SAR ADC stage 504 processes the analog residue signal to generate a digital signal $D_{out2}$. Digital signal $D_{out1}$ can represent a p-bit digital code and digital signal $D_{out2}$ can represent a q-bit digital code, where p and q are any number depending on design requirements of multichannel pipeline SAR ADC 500. Multichannel pipeline SAR ADC 500 can assemble digital signal $D_{out1}$ and digital signal $D_{out2}$ into digital output signal $D_{out}$, which may be represented as (p+q)-bit digital code. In various implementations, a digital alignment/correction module (not shown) can assemble these digital signals. Digital alignment/correction module can insert appropriate delays, insert bit shifts, correct conversion errors, perform other alignment/correction, or a combination thereof to digital signals $D_{out1}$ and $D_{out2}$ to generate digital output signal $D_{out}$. An output of multichannel pipeline SAR ADC 500 may be coupled to additional processing components, such as a digital signal processor, for processing digital signal $D_{out}$. Furthermore, multichannel pipeline SAR ADC 500 can include a controller (not shown) for managing operations thereof.

SAR ADC stage 502 includes a dedicated SAR ADC per channel—an ADC 506 for each channel—and thus includes N ADCs 506; and SAR ADC stage 504 includes a single ADC for all channels, ADC 508. ADCs 506 and ADC 508 can be configured as SAR ADC 300 depicted in FIG. 3. In the depicted embodiment, SAR ADC stage 502 includes an $ADC1_1$ that processes analog input signal $V_{in1}$ to generate a digital signal $D_{pout1}$ and an analog residue signal $V_{res1}$, an $ADC1_2$ that processes analog input signal $V_{in2}$ to generate a digital signal $D_{pout2}$ and an analog residue signal $V_{res2}$, ..., an $ADC1_{(N-1)}$ that processes analog input signal $V_{in(N-1)}$ to generate a digital signal $D_{pout(N-1)}$ and an analog residue signal $V_{res(N-1)}$, and an $ADC1_N$ that processes analog input signal $V_{inN}$ to generate a digital signal $D_{poutN}$ and an analog residue signal $V_{resN}$. SAR ADC stage 502 can thus perform analog-to-digital conversion on analog input signals $V_{in1}$, $V_{in2}$, ..., $V_{in(N-1)}$, and $V_{inN}$ in parallel (simultaneously). In furtherance of the depicted embodiment, SAR ADC stage 504 includes an ADC2 that processes analog residue signals to generate digital signals for each channel. For example, ADC2 processes analog residue signal $V_{res1}$ to generate a digital signal $D_{qout1}$ analog residue signal $V_{res2}$ to generate a digital signal $D_{qout2}$, ..., analog residue signal $V_{res(N-1)}$ to generate a digital signal $D_{qout(N-1)}$, and analog residue signal $V_{resN}$ to generate a digital signal $D_{qoutN}$. Note that digital signal $D_{pout}$ generally represents each digital signal $D_{pout1}$, $D_{pout2}$, ..., $D_{pout(N-1)}$, and $D_{poutN}$ generated by SAR ADC stage 502 respectively for channels CH1, CH2, ..., CH(N-1), and CHN; and digital signal $D_{qout}$ generally represents each digital signal $D_{qout1}$, $D_{qout2}$, ..., $D_{qout(N-1)}$, and $D_{qoutN}$ generated by SAR ADC stage 504 respectively for channels CH1, CH2, ..., CH(N-1), and CHN. Accordingly, multichannel pipeline SAR ADC 500 can assemble digital signal $D_{pout1}$ and digital signal $D_{qout1}$ into digital output signal $D_{out}$ for channel CH1, digital signal $D_{pout2}$ and digital signal $D_{qout2}$ into digital output signal $D_{out}$ for channel CH2, ..., digital signal $D_{pout(N-1)}$ and digital signal $D_{qout(N-1)}$ into digital output signal $D_{out}$ for channel CH(N-1), and digital signal $D_{poutN}$ and digital signal $D_{qoutN}$ into digital output signal $D_{out}$ for channel CHN.

Multichannel pipeline SAR ADC 500 further includes a single multiplexer and a single residue amplifier for all channels—in the depicted embodiment, a multiplexer 510 and a residue amplifier 512 shared by all channels. Multiplexer 510 is coupled to SAR ADC stage 502 and SAR ADC stage 504, such that multiplexer 510 can select one of analog residue signals $V_{res1}$, $V_{res2}$, ..., $V_{res(N-1)}$, and $V_{resN}$ for conversion by SAR ADC stage 504. In the depicted embodiment, multiplexer 510 is an N:1 multiplexer (where, as noted above, N is a number of channels of multichannel pipeline SAR ADC 500), having an input coupled to each ADC 506 (here, associated with N channels) and an output coupled to residue amplifier 512. In operation, multiplexer 510 provides one of analog residue signals $V_{res1}$, $V_{res2}$, ..., $V_{res(N-1)}$, and $V_{resN}$ to residue amplifier 512, which can process (for example, amplify and/or level shift) the selected analog residue signal for ADC 508. ADC 508 can then digitally convert an amplified version of the selected analog residue signal. SAR ADC stage 504 can thus serially convert analog residue signals $V_{res1}$, $V_{res2}$, ..., $V_{res(N-1)}$, and $V_{resN}$.

In various implementations, SAR ADC stage 502 can further include a dedicated mini-ADC for each channel. In such implementations, a mini-ADC, such as mini-ADC 412 depicted in FIG. 4, can be coupled to each ADC 506, where the mini-ADC converts analog input signals $V_{in1}$, $V_{in2}$, ..., $V_{in(N-1)}$, and $V_{inN}$ into respective digital output signals $d_1$, $d_2$, ..., $d_{(N-1)}$, and $d_{inN}$. Each digital output signal can represent an x-bit digital code. Where SAR ADC stage 502 performs the p-bit analog-to-digital conversion, the mini-ADC can generate x bits of the p-bit analog-to-digital conversion. In various implementations, SAR ADC stage 502 can include an ADC having portions duplicated across channels, and portions not duplicated across all channels. For example, SAR ADC stage 502 can include a SAR ADC, where a comparator of the SAR ADC is shared by channels CH1, CH2, ..., CH(N-1), and CHN, while each channel CH1, CH2, ..., CH(N-1), and CHN has a dedicated DAC. The dedicated DAC of each channel can be alternately coupled to (or attached) to the comparator to start conversion for the channel. In such implementations, SAR ADC stage 502 and SAR ADC stage 504 can perform conversions in a serialized manner.

Figure 6:
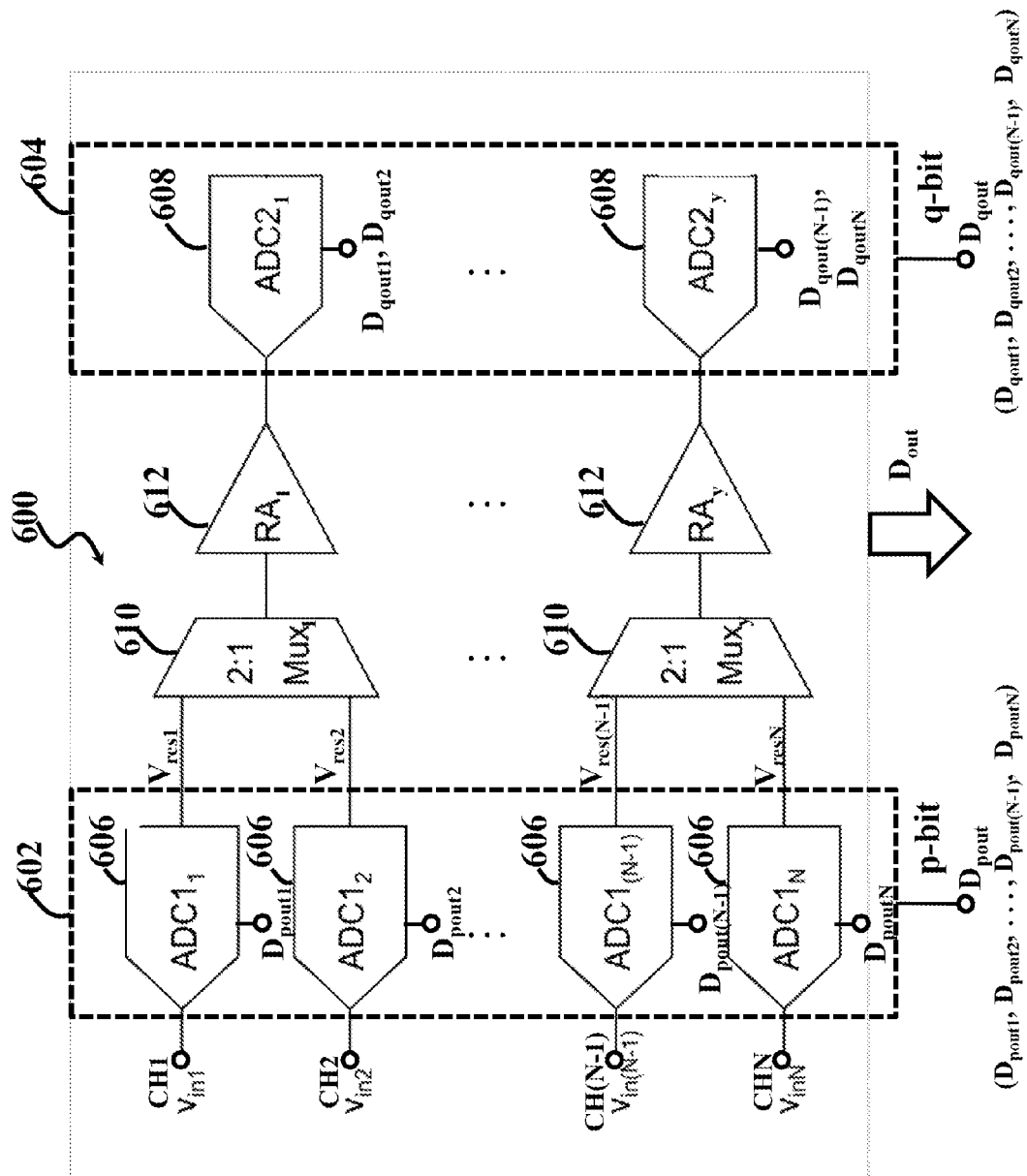
FIG. 6 is a schematic circuit diagram of another exemplary multichannel pipeline SAR ADC according to various aspects of the present disclosure.

FIG. 6 is a simplified schematic circuit diagram of another exemplary multichannel pipeline SAR ADC 600 according to various aspects of the present disclosure. Multichannel pipeline SAR ADC 600 is an electronic device (including an electronic circuit and/or one or more electronic components) configured to receive and convert an analog input signal into a corresponding digital output signal. The digital output signal can represent an n-bit digital code, where n is any number depending on design requirements of multichannel pipeline SAR ADC 600. Multichannel pipeline SAR ADC 600 represents an N-channel ADC, where N is a total number of channels, and multichannel pipeline SAR ADC 600 is configured to convert analog signals from N channels into corresponding digital signals. Generally, multichannel pipeline SAR ADC 600 implements a successive approximation algorithm to provide digital signals. FIG. 6 has been simplified for the sake of clarity to better understand the inventive concepts of the present disclosure. Additional features can be added in multichannel pipeline SAR ADC 600, and some of the features described can be replaced or eliminated in other embodiments of multichannel pipeline SAR ADC 600.

Similar to multichannel pipeline SAR ADC 500, multichannel pipeline SAR ADC 600 includes an input for receiving analog signals $V_{in1}$, $V_{in2}$, ..., $V_{in(N-1)}$, and $V_{inN}$ via channels CH1, CH2, ..., CH(N-1), and CHN. In FIG. 6, multichannel pipeline SAR ADC 600 includes cascaded stages for converting the analog signals into a digital signal $D_{out}$. For example, multichannel pipeline SAR ADC 600 includes a SAR ADC stage 602 (Stage 1) and a SAR ADC stage 604 (Stage 2). Each SAR ADC stage processes (for example, quantizes) an analog input signal to generate a digital output signal and/or an analog residue signal for a next stage of multichannel pipeline SAR ADC 600 for further processing. For example, SAR ADC stage 602 processes analog input signal $V_{in}$ to generate a digital signal $D_{out1}$ and an analog residue signal; and SAR ADC stage 604 processes the analog residue signal to generate a digital signal $D_{out2}$. Digital signal $D_{out1}$ can represent a p-bit digital code and digital signal $D_{out2}$ can represent a q-bit digital code, where p and q are any number depending on design requirements of multichannel pipeline SAR ADC 600. Multichannel pipeline SAR ADC 600 can assemble digital signal $D_{out1}$ and digital signal $D_{out2}$ into a digital output signal $D_{out}$, which may be represented as (p+q)-bit digital code. In various implementations, a digital alignment/correction module (not shown) can assemble these digital signals. Digital alignment/correction module can insert appropriate delays, insert bit shifts, correct conversion errors, perform other alignment/correction, or a combination thereof to digital signals $D_{out1}$ and $D_{out2}$ to generate digital output signal $D_{out}$. An output of multichannel pipeline SAR ADC 600 may be coupled to additional processing components, such as a digital signal processor, for processing digital signal $D_{out}$. Furthermore, multichannel pipeline SAR ADC 600 can include a controller (not shown) for managing operations thereof.

Similar to SAR ADC stage 502, SAR ADC stage 602 includes a dedicated SAR ADC per channel—an ADC 606 for each channel—and thus includes N ADCs 606. ADCs 606 can be configured as SAR ADC 300 depicted in FIG. 3. In the depicted embodiment, SAR ADC stage 602 includes an $ADC1_1$ that processes analog input signal $V_{in1}$ to generate a digital signal $D_{pout1}$ and an analog residue signal $V_{res1}$, an $ADC1_2$ that processes analog input signal $V_{in2}$ to generate a digital signal $D_{pout2}$ and an analog residue signal $V_{res2}$, ..., an $ADC1_{(N-1)}$ that processes analog input signal $V_{in(N-1)}$ to generate a digital signal $D_{pout(N-1)}$ and an analog residue signal $V_{res(N-1)}$, and an $ADC1_N$ that processes analog input signal $V_{inN}$ to generate a digital signal $D_{poutN}$ and an analog residue signal $V_{resN}$. SAR ADC stage 602 can thus perform analog-to-digital conversion on analog input signals $V_{in1}$, $V_{in2}$, ..., $V_{in(N-1)}$, and $V_{inN}$ in parallel (simultaneously). In contrast to SAR ADC stage 504, SAR ADC stage 604 includes an ADC per b of N channels, such as an ADC 608 per b channels, where b is a number of channels from 1 to N, and y is a total number of ADCs provided by SAR ADC stage 604. Each ADC 608 processes analog residue signals to generate digital signals for its respective channels. In some implementations, SAR ADC stage 604 may include N/b ADCs 608 (y=N/b), where each ADC 608 performs conversion for a same number of channels. In some implementations, ADCs 508 can perform conversion for various numbers of channels. ADCs 608 can be configured as SAR ADC 300 depicted in FIG. 3. In furtherance of the depicted embodiment, SAR ADC stage 604 includes an ADC per two channels (b=2), such as an $ADC2_1$ for channel CH1 and channel CH2, ..., and an $ADC2_y$ for channel CH(N-1) and channel CHN. $ADC2_1$ processes analog residue signal $V_{res1}$ to generate a digital signal $D_{qout1}$ and analog residue signal $V_{res2}$ to generate a digital signal $D_{qout2}$, ..., and $ADC2_y$ processes analog residue signal $V_{res(N-1)}$ to generate a digital signal $D_{qout(N-1)}$ and analog residue signal $V_{resN}$ to generate a digital signal $D_{qoutN}$. Note that digital signal $D_{pout}$ generally represents each digital signal $D_{pout1}$, $D_{pout2}$, ..., $D_{pout(N-1)}$, and $D_{poutN}$ generated by SAR ADC stage 602 respectively for channels CH1, CH2, ..., CH(N-1), and CHN, and digital signal $D_{qout}$ generally represents each digital signal $D_{qout1}$, $D_{qout2}$, ..., $D_{qout(N-1)}$, and $D_{qoutN}$ generated by SAR ADC stage 604 respectively for channels CH1, CH2, ..., CH(N-1), and CHN. Accordingly, multichannel pipeline SAR ADC 600 can assemble digital signal $D_{pout1}$ and digital signal $D_{qout1}$ into digital output signal $D_{out}$ for channel CH1, digital signal $D_{pout2}$ and digital signal $D_{qout2}$ into digital output signal $D_{out}$ for channel CH2, ..., digital signal $D_{pout(N-1)}$ and digital signal $D_{qout(N-1)}$ into digital output signal $D_{out}$ for channel CH(N-1), and digital signal $D_{poutN}$ and digital signal $D_{qoutN}$ into digital output signal $D_{out}$ for channel CHN.

In further contrast to multichannel pipeline SAR ADC 500, multichannel pipeline SAR ADC 600 includes a multiplexer and a residue amplifier per b channels—for example, a multiplexer 610 and a residue amplifier 612 per b of N channels. In the depicted embodiment, having an ADC per two channels (b=2), multichannel pipeline SAR ADC 600 includes a multiplexer and a residue amplifier per two channels, such as a $MUX_1$ and a $RA_1$ for channel CH1 and channel CH2, ..., and a $MUX_y$ and a $RA_y$ for channel CH(N-1) and channel CHN. $MUX_1$, ..., and $MUX_y$ are coupled to SAR ADC stage 602 and SAR ADC stage 604, such that $MUX_1$ can select one of analog residue signals $V_{res1}$ and $V_{res2}$ for conversion by $ADC2_1$, ..., and $MUX_y$ can select one of analog residue signals $V_{res(N-1)}$ and $V_{resN}$ for conversion by $ADC2_y$. $MUX_1$, ..., and $MUX_y$ are b:1 multiplexers (such as 2:1 multiplexers where b=2), having an input coupled to b ADCs 606 (here, associated with b of N channels) and an output coupled respectively to $RA_1$, ..., and $RA_y$. In operation, $MUX_1$ provides one of analog residue signals $V_{res1}$ and $V_{res2}$ to residue amplifier $RA_1$, which can process (for example, amplify and/or level shift) the selected analog residue signal for $ADC2_1$. $ADC2_1$ can then digitally convert an amplified version of the selected analog residue signal. Similarly, $MUX_y$ provides one of analog residue signals $V_{res(N-1)}$ and $V_{resN}$ to residue amplifier $RA_y$, which can process (for example, amplify and/or level shift) the selected analog residue signal for $ADC2_y$. $ADC2_y$ can then digitally convert an amplified version of the selected analog residue signal. SAR ADC stage 604 can thus serially convert analog residue signals $V_{res1}$ and $V_{res2}$, ..., and analog residue signals $V_{res(N-1)}$, and $V_{resN}$ in parallel, which can enhance throughput of multichannel pipeline SAR ADC 600. In some implementations, SAR ADC stage 604 may include N/b ADCs 608 (y=N/b), where each ADC 608 performs conversion for a same number of channels.

In various implementations, SAR ADC stage 602 can further include a dedicated mini-ADC for each channel. In such implementations, a mini-ADC, such as mini-ADC 412 depicted in FIG. 4, can be coupled to each ADC 606, where the mini-ADC converts analog input signals $V_{in1}$, $V_{in2}$, ..., $V_{in(N-1)}$, and $V_{inN}$ into respective digital output signals $d_1, d_2, ..., d_{(N-1)}$, and $d_{inN}$. Each digital output signal can represent an x-bit digital code. Where SAR ADC stage 602 performs the p-bit analog-to-digital conversion, the mini-ADC can generate x bits of the p-bit analog-to-digital conversion. In various implementations, SAR ADC stage 602 can include an ADC having portions duplicated across channels, and portions not duplicated across all channels. For example, SAR ADC stage 602 can include a SAR ADC, where a comparator of the SAR ADC is shared by channels CH1, CH2, ..., CH(N-1), and CHN, while each channel CH1, CH2, ..., CH(N-1), and CHN has a dedicated DAC. The dedicated DAC of each channel can be alternately coupled to (or attached) to the comparator to start conver-sion for the channel. In such implementations, SAR ADC stage 602 and SAR ADC stage 604 can perform conversions in a serialized manner.

By modifying a first stage of a pipeline SAR ADC to include a dedicated SAR ADC per channel (essentially duplicating ADCs for each channel) while sharing SAR ADCs in subsequent stages among all the channels, multichannel pipeline SAR ADC 500 and multichannel pipeline SAR ADC 600 can eliminate a charge sharing scheme, such as described above, utilized by many multichannel ADCs. More specifically, the multichannel pipeline SAR ADCs described herein can directly sample using DACs of the duplicated SAR ADCs, and then perform first stage conversions in a parallel manner, while the subsequent stage conversions are performed in a serial manner. By eliminating the charge sharing scheme between the sampling capacitors and the SAR ADC capacitors (such as depicted with reference to multichannel ADC 100 and multichannel ADC 200), multichannel pipeline SAR ADC 500 and multichannel pipeline SAR ADC 600 can boost signal-to-noise ratio and throughput (such as conversion speeds). For example, in various implementations, multichannel pipeline SAR ADC 500 and multichannel pipeline SAR ADC 600 realize signal-to-noise ratio similar to that of multichannel ADC 100, while minimizing any device area penalty. In another example, in various implementations, multichannel pipeline SAR ADC 500 and multichannel pipeline SAR ADC 600 realize throughputs significantly higher than multichannel ADC 200. Multichannel pipeline SAR ADC 500 and multichannel pipeline SAR ADC 600 can thus strike an optimal balance for achieving desired device and/or performance metrics, including signal-to-noise ratio, throughput, and/or device area. Such configurations can be implemented in a number of multichannel systems, where the demand for improved signal-to-noise ratio and throughput while minimizing device footprint, continues to increase.

Figure 7:
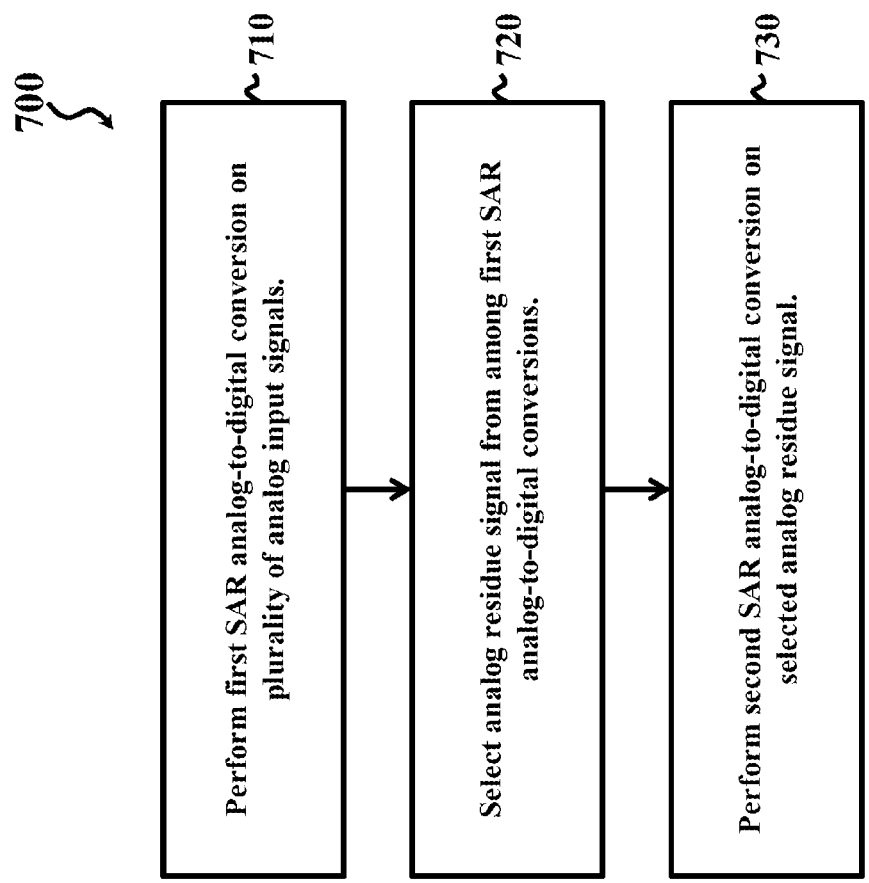
FIG. 7 is a simplified flowchart of exemplary method that can be implemented for performing multichannel analog-to-digital conversion according to various aspects of the present disclosure.

FIG. 7 is a simplified flowchart of exemplary method 700 that can be implemented for performing multichannel analog-to-digital conversion according to various aspects of the present disclosure. In various implementations, method 700 can be implemented by a multichannel pipeline SAR ADC, such as multichannel pipeline SAR ADC 500 or multichannel pipeline SAR ADC 600 described above. At block 710, a first SAR analog-to-digital conversion is performed on a plurality of analog input signals. In some implementations, the plurality of analog input signals can be sampled and converted in parallel. At block 720, an analog residue signal is selected from among the first SAR analog-to-digital conversions. In some implementations, the analog residue signal can be selected from among all of the first SAR analog-to-digital conversions. In some implementations, where the plurality of analog input signals includes N analog input signals, the analog residue signal can be selected from among b of the first SAR analog-to-digital conversions. At block 730, a second SAR analog-to-digital conversion is performed on the selected analog residue signal. The method can further include amplifying the selected analog residue signal. In some implementations, each selected analog residue signal is sampled and converted serially. FIG. 7 has been simplified for the sake of clarity to better understand the inventive concepts of the present disclosure. Additional steps can be provided before, during, and after method 700 and some of the steps described can be replaced or eliminated for other embodiments of method 700.

In various implementations, multichannel systems, multichannel ADCs (for example, multichannel ADC 100, multichannel 200, multichannel pipeline SAR ADC 500, and multichannel pipeline SAR ADC 600), and/or the various circuits and/or components of the FIGURES can be implemented on a board of an associated electronic device. The board can be a general circuit board that can hold various components of an internal electronic system of the electronic device and, further, provide connectors for other peripherals. The board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, other considerations, or a combination thereof. Other components, such as external storage, sensors, controllers for audio/video display, and peripheral devices may be attached to the board as plug-in cards, via cables, or integrated into the board itself.

In various implementations, multichannel systems, multichannel ADCs (for example, multichannel ADC 100, multichannel 200, multichannel pipeline SAR ADC 500, and multichannel pipeline SAR ADC 600), and/or the various circuits and/or components of the FIGURES can be implemented as stand-alone modules (for example, a device with associated components and circuitry configured to perform a specific application or function) or implemented as plug-in modules into application specific hardware of electronic devices. Note that particular embodiments of the present disclosure may be readily included in a system-on-chip (SOC) package, either in part, or in whole. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the various functions described herein may be implemented in one or more semiconductor cores (such as silicon cores) in application specific integrated circuits (ASICs), field programmable gate arrays (FPGAs), other semiconductor chips, or combinations thereof.

Note that the activities discussed above with reference to the FIGURES are applicable to any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily be part of smartphones, tablets, security systems, PCs, gaming technologies, virtual reality, simulation training, etc.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than a restrictive sense. Further the various circuitry configurations described above can be replaced, substituted, or otherwise modified to accommodate various design implementations that achieve the multichannel conversion mechanisms described herein. Moreover, using complementary electronic devices, hardware, software, etc. can offer an equally viable option for implementing the teachings of the present disclosure.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, circuits, and elements of the FIGURES may be combined in various possible configurations, all of which are clearly within the broad scope of this Specification. In certain cases, it may be easier to describe one or more of the functionalities of a given set of flows by only referencing a limited number of electrical components. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures. Further, note that references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", "various implementations", "some implementations", "an implementation", and the like are intended to mean that any such features are included in one or more embodiments of the present disclosure, but may or may not necessarily be combined in the same embodiments. It is further noted that "coupled to" and "coupled with" are used interchangeably herein, and that references to a feature "coupled to" or "coupled with" another feature include any communicative coupling means, electrical coupling means, mechanical coupling means, other coupling means, or a combination thereof that facilitates the feature functionalities and operations, such as the multichannel conversion mechanisms, described herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

In various implementations, a system is provided that can be part of any type of computer, which can further include a circuit board coupled to a plurality of electronic components. The system can include means for performing a first SAR analog-to-digital conversion on a plurality of analog input signals; means for selecting an analog residue signal from among the first SAR analog-to-digital conversions; and means for performing a second SAR analog-to-digital conversion on the selected analog residue signal. The 'means for' can also or alternatively include (but is not limited to) using any suitable component discussed herein, along with any suitable software, circuitry, hub, computer code, logic, algorithms, hardware, controller, interface, link, bus, communication pathway, etc. In various implementations, the system includes memory that includes instructions that when executed cause the system to perform any of the activities discussed herein. In various implementations, the various functions outlined herein may be implemented by logic encoded in one or more non-transitory and/or tangible media (for example, embedded logic provided in an application specific integrated circuit (ASIC), as digital signal processor (DSP) instructions, software (potentially inclusive of object code and source code) to be executed by a processor, or other similar machine, etc.).

What is claimed is:

1. A multichannel successive approximation register (SAR) analog-to-digital converter (ADC), the multichannel SAR ADC comprising:
    a first SAR ADC for each of a plurality of input channels, wherein the first SAR ADC is configured to receive a respective analog input signal from a respective input channel; and
    a second SAR ADC and a multiplexer shared among the plurality of input channels, the multiplexer configured to select an analog residue signal from one of the first SAR ADCs for conversion by the second SAR ADC.

2. The multichannel SAR ADC of claim 1, further comprising a residue amplifier coupled to the second SAR ADC and the multiplexer, the residue amplifier configured to amplify the selected residue analog signal.

3. The multichannel SAR ADC of claim 1, wherein the second SAR ADC and the multiplexer are shared among all of the plurality of input channels.

4. The multichannel SAR ADC of claim 1, wherein:
    the plurality of input channels includes N input channels; and
    the second SAR ADC and the multiplexer are shared among b channels of the N input channels, wherein b is an integer from 2 to N, the multiplexer configured to select the analog residue signal from one of the first SAR ADCs associated with the b channels.

5. The multichannel SAR ADC of claim 4, further comprising N/b second SAR ADCs and multiplexers, such that each second SAR ADC performs conversion for b channels.

6. The multichannel SAR ADC of claim 1, wherein:
    the first SAR ADCs are configured to generate in parallel a respective first digital signal and a respective analog residue signal from the respective analog input signal; and
    the second SAR ADC is configured to serially generate second digital signals from the respective analog residue signals.

7. The multichannel SAR ADC of claim 6, wherein the first SAR ADCs are configured to directly sample respective analog input signals.

8. The multichannel SAR ADC of claim 6, wherein:
    the first SAR ADCs include a first comparator, a first digital-to-analog converter (DAC), and a first SAR controller, wherein each first SAR ADC generates the respective first digital signal by comparing the respective analog input signal with a respective first DAC reference voltage; and
    the second SAR ADC includes a second comparator, a second DAC, and a second SAR controller, wherein the second SAR ADC generates the second digital signal for each channel by comparing each respective analog residue signal with a second DAC reference voltage.

9. The multichannel SAR ADC of claim 1, further comprising an ADC coupled to the first SAR ADC for each of the plurality of input channels, wherein the first SAR ADC is configured to perform a p-bit analog-to-digital conversion, and the ADC is configured to generate x bits of the p-bit analog-to-digital conversion, wherein p is a number of digital code bits and x is a number of digital code bits.

10. The multichannel SAR ADC of claim 9, wherein the ADC is configured to generate most significant bits of the p-bit analog-to-digital conversion.

11. A method for performing multichannel successive approximation register (SAR) analog-to-digital conversion, the method comprising:
    performing a plurality of first SAR analog-to-digital conversions in parallel on a plurality of analog input signals;
    selecting an analog residue signal from among the plurality of first SAR analog-to-digital conversions; and
    performing a second SAR analog-to-digital conversion on the selected analog residue signal.

12. The method of claim 11, further comprising amplifying the selected analog residue signal.

13. The method of claim 11, wherein the analog residue signal is selected from among all of the first SAR analog-to-digital conversions.

14. The method of claim 11, wherein the plurality of analog input signals includes N analog input signals, and the analog residue signal is selected from among b of the first SAR analog-to-digital conversions, wherein b is an integer from 2 to N.

15. The method of claim 11 wherein:
performing the plurality of first SAR analog-to-digital conversions in parallel includes, for each first SAR analog-to-digital conversion, generating a respective first digital signal and a respective analog residue signal from a respective analog input signal; and
performing the second SAR analog-to-digital conversion includes serially generating second digital signals from the respective analog residue signals.

16. The method of claim 11, wherein at least one of the plurality of first SAR analog-to-digital conversions is a p-bit analog-to-digital conversion, the method further comprising performing an analog-to-digital conversion to generate x bits of the p-bit analog-to-digital conversion, wherein p is a number of digital code bits and x is a number of digital code bits.

17. The method of claim 11, further comprising directly sampling the plurality of analog input signals.

18. A multichannel analog-to-digital conversion system comprising:
means for performing a plurality of first SAR analog-to-digital conversions in parallel on a plurality of analog input signals;
means for selecting an analog residue signal from among the plurality of first SAR analog-to-digital conversions; and
means for performing a second SAR analog-to-digital conversion on the selected analog residue signal.

19. The multichannel analog-to-digital conversion system of claim 18, further comprising means for amplifying the selected analog residue signal.

20. The multichannel analog-to-digital conversion system of claim 18, wherein the first SAR analog-to-digital conversion is a p-bit analog-to-digital conversion, the analog-to-digital conversion further comprising means for performing an analog-to-digital conversion to generate x bits of the p-bit analog-to-digital conversion, wherein p is a number of digital code bits and x is a number of digital code bits.

* * * * *